(12) United States Patent
Ziger

(10) Patent No.: US 7,492,465 B2
(45) Date of Patent: Feb. 17, 2009

(54) METHOD FOR DETERMINING OPTIMAL RESIST THICKNESS

(75) Inventor: David Ziger, San Antonio, TX (US)

(73) Assignee: NXP B.V., Eindhoven (NL)

(*) Notice: Subject to any disclaimer, the term of this patent is extended or adjusted under 35 U.S.C. 154(b) by 493 days.

(21) Appl. No.: 10/568,653

(22) PCT Filed: Aug. 7, 2004

(86) PCT No.: PCT/IB2004/002546

§ 371 (c)(1),
(2), (4) Date: Feb. 15, 2006

(87) PCT Pub. No.: WO2005/015312

PCT Pub. Date: Feb. 17, 2005

(65) Prior Publication Data

US 2008/0206687 A1    Aug. 28, 2008

Related U.S. Application Data

(60) Provisional application No. 60/512,717, filed on Oct. 20, 2003, provisional application No. 60/493,698, filed on Aug. 8, 2003.

(51) Int. Cl.
*G01B 9/02* (2006.01)

(52) U.S. Cl. .................. 356/485; 356/503; 356/630

(58) Field of Classification Search ........... 356/485, 356/503, 630; 438/5, 7, 14, 16; 118/663, 118/664, 688, 712; 430/22, 30
See application file for complete search history.

(56) References Cited

U.S. PATENT DOCUMENTS

| 5,916,717 A | * | 6/1999 | Yang et al. ............... 430/30 |
| 5,960,023 A | * | 9/1999 | Takahashi ................ 372/96 |
| 2002/0163649 A1 | * | 11/2002 | Hirose et al. ............. 356/504 |

OTHER PUBLICATIONS

Andre Schiltz, Concept of two-dimensional swing curves for critical dimension prediction and optimization of resist/antireflective coating bilayers in topographic situations, Mar. 2000, SPIE, Optical Engineering, pp. 776-786.*

* cited by examiner

*Primary Examiner*—Roy M Punnoose
*Assistant Examiner*—Michael Lapage
(74) *Attorney, Agent, or Firm*—Peter Zawilski

(57) ABSTRACT

In an example embodiment, there is a method (600) for determining an approximately optimal resist thickness comprising providing a first substrate coated with a resist film having a first thickness using a first coat program, (605, 610). The first thickness of resist is measured (615, 620). A second substrate is provided (625) and coated with a resist film using the first coat program. The resist film on the second substrate is exposed to radiation. The reflectance spectrum near the actinic wavelength of the resist film is measured (630). As a function of the periodicity of the reflectance spectrum, an effective refractive index is determined. Based on the effective refractive index, a periodicity of a swing curve of the resist film coated on the second substrate is determined (635). The maxima and minima are determined as a function of the periodicity.

19 Claims, 11 Drawing Sheets

METHOD FOR DETERMINING OPTIMAL RESIST THICKNESS

CROSS REFERENCE TO RELATED APPLICATION

This application claims the benefit of U.S. provisional application Ser. No. 60/512,717 filed Oct. 20, 2003, and 60/493,698 filed Aug. 8, 2003 which is incorporated herein whole by reference.

The invention relates generally to semiconductor fabrication and more particularly to a method for determining an approximately optimal resist thickness of photosensitive materials.

There is a constant drive within the semiconductor industry to increase the operating speed of integrated circuit devices such as microprocessors, memory devices, etc. The demand for increased speed is resulting in a continuing reduction in the size of, for example, channel lengths, junction depths, and gate insulation thicknesses of semiconductor devices. This high degree of integration of semiconductor devices is only achieved by using a simultaneously highly developed fabrication technology.

Most semiconductor devices are fabricated using photolithography. In photolithography, a thin photo resist film is coated onto the surface of a semiconductor wafer. Using a patterned mask and ultraviolet light, the photo resist film is exposed such that the pattern is transferred from the mask to the photo resist film as a latent pattern. After the exposure, the photo resist film is developed to remove the exposed portion of the film. The magnitude of the exposure dose needed to complete the photochemical transformation depends on the thickness of the photo resist film and on the pattern to be transferred. Since the thickness of the photo resist film is of a same order of magnitude as the actinic wavelength, the amount of light coupled into the photo resist film is strongly dependent on the thickness. The actinic wavelength of the UV radiation is that wavelength that produces chemical changes in the photo resist film, resulting in the resist film being "exposed." The effect of the photo resist film thickness on line width is known as "swing curve" effect. In general, the swing curve is a sinusoidal function. Line width variation is resist thickness deviation due to thin film interference. The basic principle, which is known in the literature, is shown in FIG. 1A. The incident radiation 40 (at an angle $\Phi$) is reflected off the resist surface 30 and underlying thin film interfaces 20 present on the substrate 10. To minimize the effects of variations in the thickness of the photo resist film on the line width for modern highly integrated semiconductor devices, it is desirable to operate the photolithography processes at maxima or minima of the swing curve. Unless reflections are minimized, the dose coupled into the photo resist has a sinusoidal dependence on the resist thickness, commonly referred to as a swing curve. For example, FIG. 1B shows an example of a swing curve published by Brunner[1] for a resist exposed with 248 nm radiation and annular illumination.

There are several methods for determining the thickness of a photo resist film at maxima of the swing curve. In a first method wafers having photo resist films of various thicknesses coated thereupon are prepared, the thickness of each of the photo resist films is measured, and then the wafers are exposed using a patterned mask and developed. After development, a particular feature is measured on all wafers and its dimension is tabulated or plotted as a function of the resist thickness, generally resulting in a sinusoidal curve. In a second method wafers having photo resist film of varying thicknesses coated thereupon are exposed using increasing exposure doses. The dose for each wafer at which the resist clears or has the same optically measured thickness is then recorded. Alternatively, a single wafer is coated with a resist having a varying thickness across the wafer. The resist thickness in various regions is measured, and then the wafer is exposed, developed, and the line width in the regions is measured. The line width or dose-to-clear measurements are compared to the resist thicknesses before exposure. In a third method, the swing curve is modeled based on given or measured physical parameters of the materials and radiation used in the process. For example, "PROLITH" (KLA/TENCOR) enables modeling of swing curves.

There are significant challenges to these approaches. The first and second methods are very labor intensive and the measurement results—dose to clear or line width versus resist thickness—are typically very noisy due to process variations. The single wafer approach requires fabrication of a topography wafer, which is likely not representative of later processing methods used in actual integrated circuit devices. The third method of modeling is more convenient to perform than measuring of the swing curve. However, it requires detailed knowledge of many optical and physical parameters, such as the refractive index, which may not be readily available for numerous applications.

There is a need to provide a method for determining an approximately optimal resist thickness having substantially increased accuracy while reducing the cost and effort in obtaining such data. The present invention provides a method for measuring the optimal thickness of photo resist required to reduce critical dimension (CD) variation using UV reflectance spectroscopy.

In an example embodiment according to the present invention, there is a method for determining an approximately optimal resist thickness comprising the steps of, providing a first substrate coated with a resist film having a first thickness using a first coat program. The first thickness is measured. A second substrate is provided and is coated with a resist film using the first coat program. The resist film on the second substrate is exposed to radiation; a reflectance spectrum near the actinic wavelength of the resist film is measured. The effective refractive index is a function of the periodicity of the reflectance spectrum. The periodicity of a swing curve of the resist film coated on the second substrate is determined based on the effective refractive index. As a function of periodicity, the maxima and minima are determined.

In another example embodiment according to the present invention, there is a method for determining an approximately optimal resist thickness comprising the steps of, providing a first substrate coated with a resist film having a first thickness using a first coat program; the first thickness is near a lower limit of a predetermined range for the optimal thickness. The first thickness is measured. Using the first coat program, a second substrate coated with a resist film is provided. The resist film on the second substrate is exposed to UV radiation; a UV reflectance spectrum near the actinic wavelength of the resist film is measured. As a function of the periodicity of the reflectance spectrum, the effective refractive index is determined. Based upon the effective refractive index, the periodicity of a swing curve of the resist film on the second coated substrate is determined. The maxima and minima are determined as a function of the periodicity.

In yet another example embodiment according to the present invention, there is a method for determining an approximately optimal resist thickness. The method comprises providing two wafers comprising a simple first substrate and providing two wafers comprising a second substrate. The two wafers comprising the simple first substrate are coated with resist films having a first and a second thickness near an upper and a lower limit of the predetermined range for the optimal resist thickness, respectively, using a first and a second coat program. The first and the second thickness are measured. Using the first and second coat program, two wafers comprising the second substrate are coated with resist films. The resist film on the two wafers comprising the second substrate is exposed to UV radiation; a first and a second UV reflectance spectrum near the actinic wavelength of the resist films are measured. The sinusoidal components of the first and the second UV reflectance spectrum are fitted. Base on the fitted sinusoidal components of the first and the second UV reflectance spectrum, a first and a second effective refractive index at the actinic wavelength is determined. Using the first and the second effective refractive index, respectively, minima and maxima of a first and a second swing curve are determined. Corrected minima and maxima are determined by averaging the minima and maxima of the first and the second swing curve.

The above summaries of the present invention are not intended to represent each disclosed embodiment, or every aspect, of the present invention. Other aspects and example embodiments are provided in the figures and the detailed description that follow.

The invention may be more completely understood in consideration of the following detailed description of various embodiments of the invention in connection with the accompanying drawings, in which.

The present invention has been found to be useful in determining a resist thickness suitable for a given photo lithographic process. The UV reflectance spectra of a resist-coated wafer are measured. The reflectance spectra may be used to extract meaningful parameters from which the periodicity of the swing curve may be determined.

In an example embodiment according to the present invention, a method for determining an optimal resist thickness is based on measuring ultraviolet (UV) reflectance spectra of resist coated wafers near an actinic wavelength of the resist. The UV reflectance spectra allow extraction of parameters for determining the swing curve periodicity. Using the UV reflectance spectra for determining an optimal resist thickness substantially reduces the number of resist coated wafers employed for determining the parameters.

The electric field $E_{(x,y,z)}$ in a material—resist film—exposed to radiation is given as:

$$E_{(x,y,z)} = E_{(x,y)} \frac{\tau_{12}(e^{-i2\pi n_2 z/\lambda} + \rho_{12}\tau_D^2 e^{i2\pi n_2 z/\lambda})}{1 + \rho_{12}\rho_{23}\tau_D^2} \quad (1)$$

wherein, $E_{(x,y)}$ is an incident plane wave at the surface of the material, $\rho_{12}=(n_1-n_2)/(n_1+n_2)$ is the reflection coefficient, $\tau_{12}=2n_1/(n_1+n_2)$ is the transmission coefficient, $\tau_D$ is the internal transmittance of the material, $k_2=2\pi n_2/\lambda$ is the propagation constant, $n_j=n_j-ik_j$ is the complex index of refraction, and $n_{(\lambda)}=C_1+C_2/\lambda^2+C_3/\lambda^4$ is the Cauchy expansion for the refractive index.

Exposure intensity is proportional to the square of the electric field. Furthermore, the average intensity is proportional to the square of the electric field integrated over the resist film thickness divided by the thickness. The measured reflectance spectra have a same functional dependence on periodicity. Thus, the reflectance intensity is given as:

$$I = gf_{(\cos(4\pi n_2 t/\lambda))} \quad (2)$$

wherein g is a function of optical constants of the substrate and the resist film and t is the resist film thickness. The periodicity of the reflectance spectra is given by $\cos(4\pi n_2 t/\lambda)$. This is well known in the art and is used to calculate thin film thicknesses.

Below is a generalized sinusoidal behavior of swing curves' expression for standing wave intensity[2]:

$$I \propto \cos(\phi + \delta) \quad (3)$$

where:

$$\phi \approx \frac{4\pi nD}{\lambda}\left[1 - \frac{\sin^2\theta}{2n^2}\right]$$

I=average intensity averaged over the resist thickness
$n_{(\lambda)}$=resist refractive index
D=resist thickness
λ=wavelength
φ=incident angle
δ=phase shift from the reflective interfaces In the above equation, the term $$1 - \frac{\sin^2 \theta}{2n^2}$$

corrects for the effect of incident radiation at non-normal angles.

Figure 7:
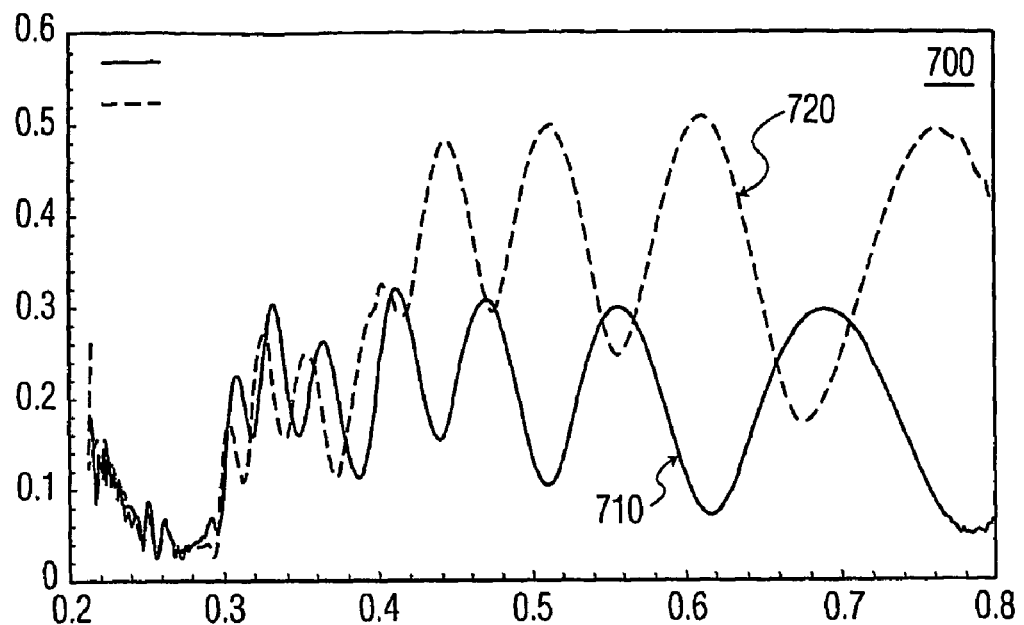
FIG. 7 depicts reflectivity spectra of 0.83 μm OIR32HD with 0.065 μm Aquatar coated on silicon and gate stack substrates.

EQ. 3 predicts a sinusoidal behavior of swing curves owing to resist thickness, D, and wave number, 1/λ. As mentioned earlier, the swing curve with a given resist thickness can cause line width variation unless reflectivity at the actinic (or exposure) wavelength is minimized or resist thicknesses are relatively uniform. The sinusoidal dependence of ultraviolet (UV) reflectivity due to wave number 1/λ, is the basis for optical calculations of resist thickness. Refer to FIG. 7. The solid line 710 in FIG. 7 shows a UV reflectance spectrum of 650 Å Aquatar II coated on bare silicon, with 0.83 μm OIR32HD resist. The dashed line 720 shows a UV reflectance spectrum of 650 Å Aquatar II coated on 0.83 μm OIR32HD resist on a gate stack. The substrate is bare silicon. Note the pronounced waves or swing with wavelength.

According to EQ. 3, we expect a sinusoidal behavior with wave number on more complicated substrates is expected but that δ should vary depending on the reflectance at the underlying interfaces. EQ. 3 may be used as a guide and allow δ to be a quadratic function of wave number:

$$\delta = \delta_0 + \delta_1/\lambda + \delta_2/\lambda^2 \quad (4)$$

Consequently, if the reflectivity spectra of a coated wafer may be predicted were measured, then $\delta_0$, $\delta_1$ and $\delta_2$ can, in principle, be regressed from its periodic nature provided that the resist thickness has been measured and refractive index of the resist is known as a function of wavelength. For the latter, let us assume that the Cauchy equation provides an adequate representation of the wavelength dependence of the refractive index:

$$n_{(\lambda)} = n_0 + \frac{n_2}{\lambda^2} + \frac{n_4}{\lambda^4} \quad (5)$$

One may predict the periodicity of the swing wave curve from the periodicity of a single spectrum by evaluating both φ and δ at the exposure wavelength. In other words, the goal is to utilize reflectance spectra from a single wafer to predict the local extrema of line width versus resist thickness. This process may be applied to structures various film stacks and topographies of interest.

Figure 1A:
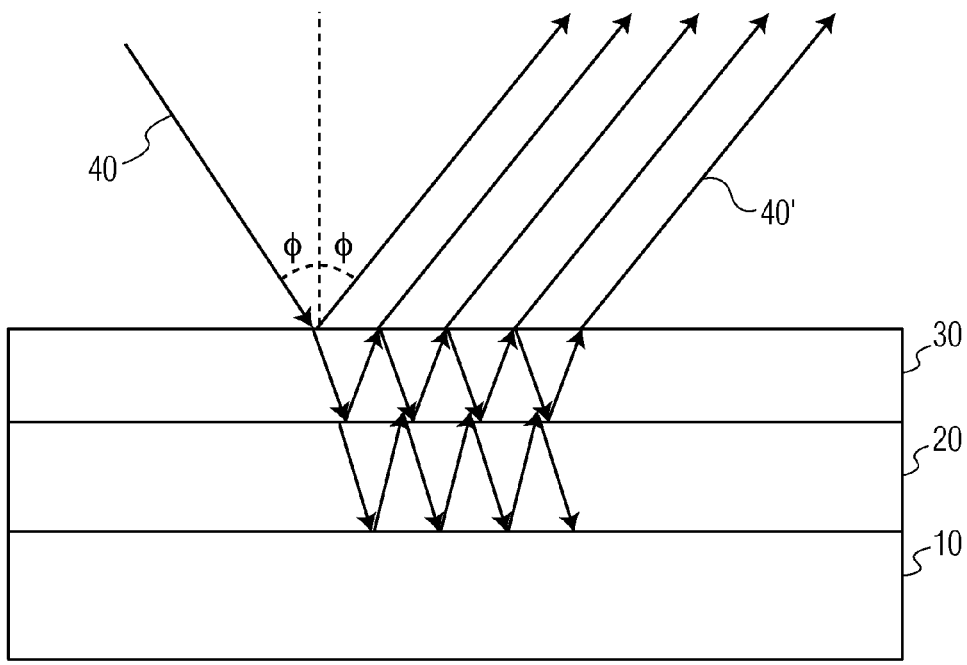
FIG. 1A shows the thin film effect on incident radiation striking a substrate surface.
Figure 1B:
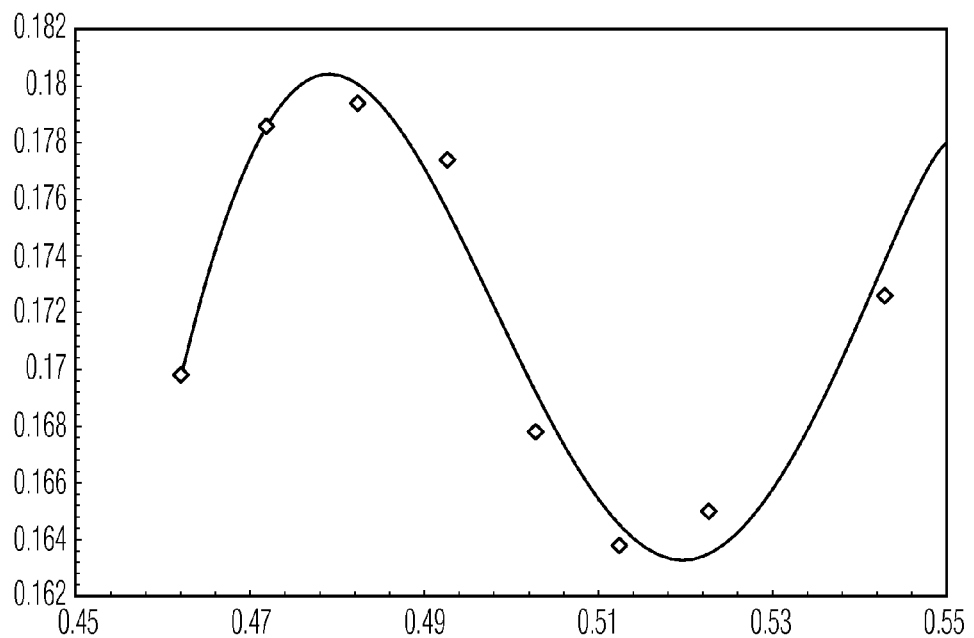
FIG. 1B shows an example of sinusoidal dependence on resist thickness for high numerical aperture (NA) annular illumination exposed at 248 nm.
Figure 2:
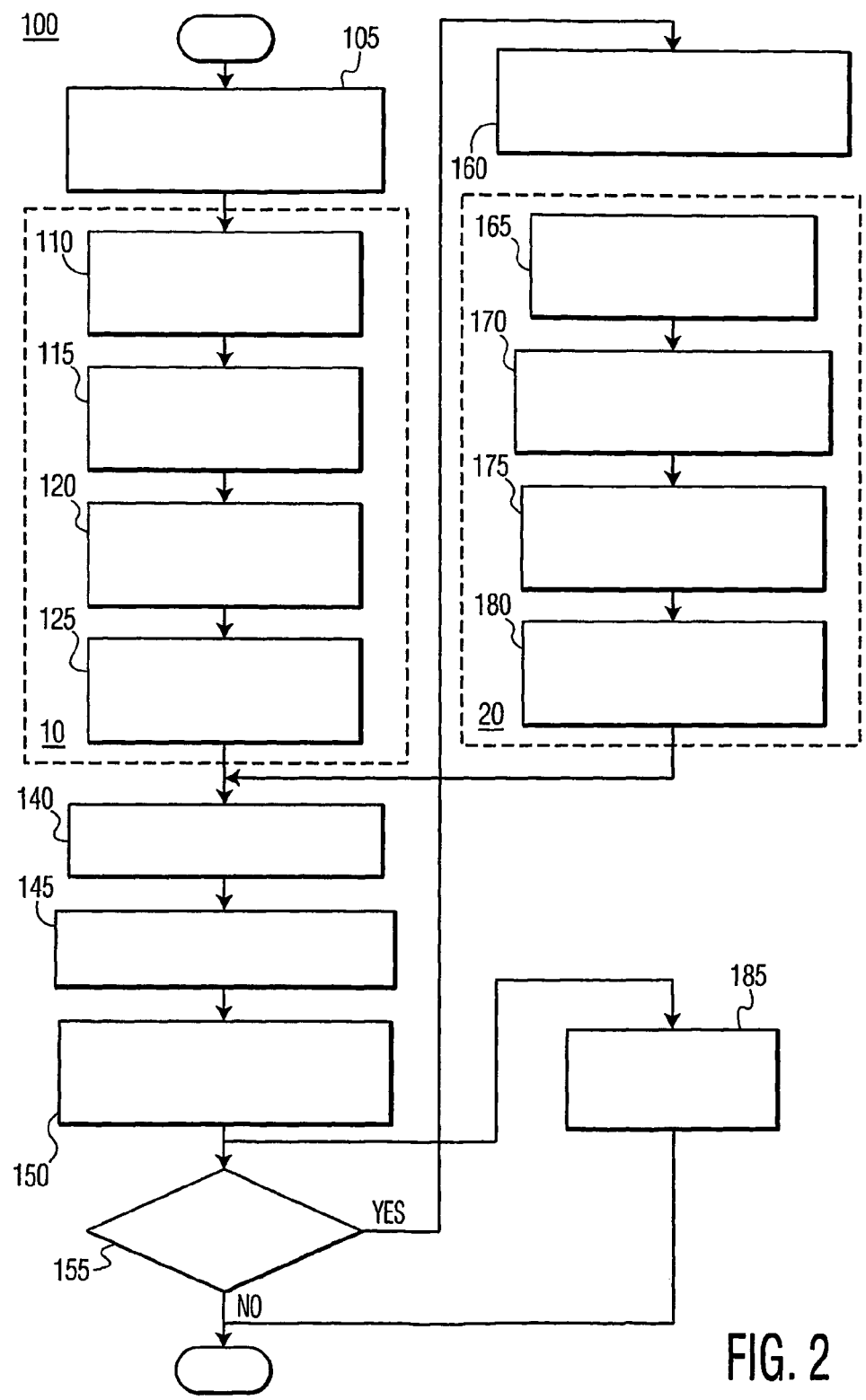
FIG. 2 is a flowchart illustrating a method for calculating the average predicted maxima and minima according to an embodiment of the present invention.

Referring back to FIG. 2, in example embodiment according to the present invention, a method 100 may be used to determine a resist film thickness. A resist dispenser is programmed to deposit a coat of resist 105 at a first predetermined thickness. The thickness of the resist film is chosen to be near the lower limit of a predetermined range for an optimal resist thickness. In a series of steps 10, resist is deposited at the first predetermined thickness (using the same coating program) on a first wafer 110. The resist thickness on the first wafer is measured 115. The resist dispenser is reprogrammed to deposit resist 120 at the first measured thickness. On a second wafer, the dispenser coats the wafer at the first measured thickness 125. Having obtained a coated wafer, the UV reflectance spectra are measured in a region near the actinic wavelength, for a given thickness (previously measured) 140. For the measured thickness, the effective refractive index 145 is extracted for a measured thickness. This effective refractive index is determined by fitting the periodicity of the reflectance spectrum to the cosine argument, $\cos(4\pi n_2 t/\lambda)$. Using the effective refractive index near the actinic wavelength, periodicity of a swing curve of the resist film thickness is determined by keeping the wavelength constant and varying the resist film thickness. The periodicity of the effective refractive index 150 for a measured thickness is predicted.

Additional measurements are often desirable. The user requiring additional measurements 155, will program the resist dispenser to deposit a coat of resist of another (second or additional) predetermined thickness 160, the resist film having a thickness near an upper limit of the predetermined range. As in the group of steps 10, group of steps 20 include depositing a resist at another predetermined thickness 165 on another first wafer. The resist thickness is measured on another first wafer 170. The resist dispenser is programmed to deposit resist 175 at the second or additional measured thickness. Steps 140, 145, and 150 are repeated for the second or additional measured thicknesses. If no additional measurements are desired 155, the average predicted 185 maxima and minima are calculated.

The corrected maxima and minima are determined as average of the maxima and minima obtained from the periodicities of the swing curves for the two or more resist film thicknesses. The corrected maxima and minima are weighted by a distance between the corrected values and the calculated maxima and minima calculated.

In the following example embodiment, the optimal resist thickness is determined for SPR660 between 0.8 μm and 0.9 μm coated on a substrate comprising a film stack of 1600 Å silicon nitride, 500 Å amorphous silicon, 300 Å pad oxide, and silicon. Two bare silicon wafers are coated with resist film having a thickness near an upper and a lower limit of the predetermined range—between 0.8 μm and 0.9 μm—for the optimal resist thickness, respectively. One resist film has a measured thickness of 0.771 μm and the other has a measured thickness of 0.880 μm. Using the same coat program, two substrates comprising the film stack above are coated with resist films having thicknesses of 0.771 μm and 0.880 μm, respectively.

Figure 3:
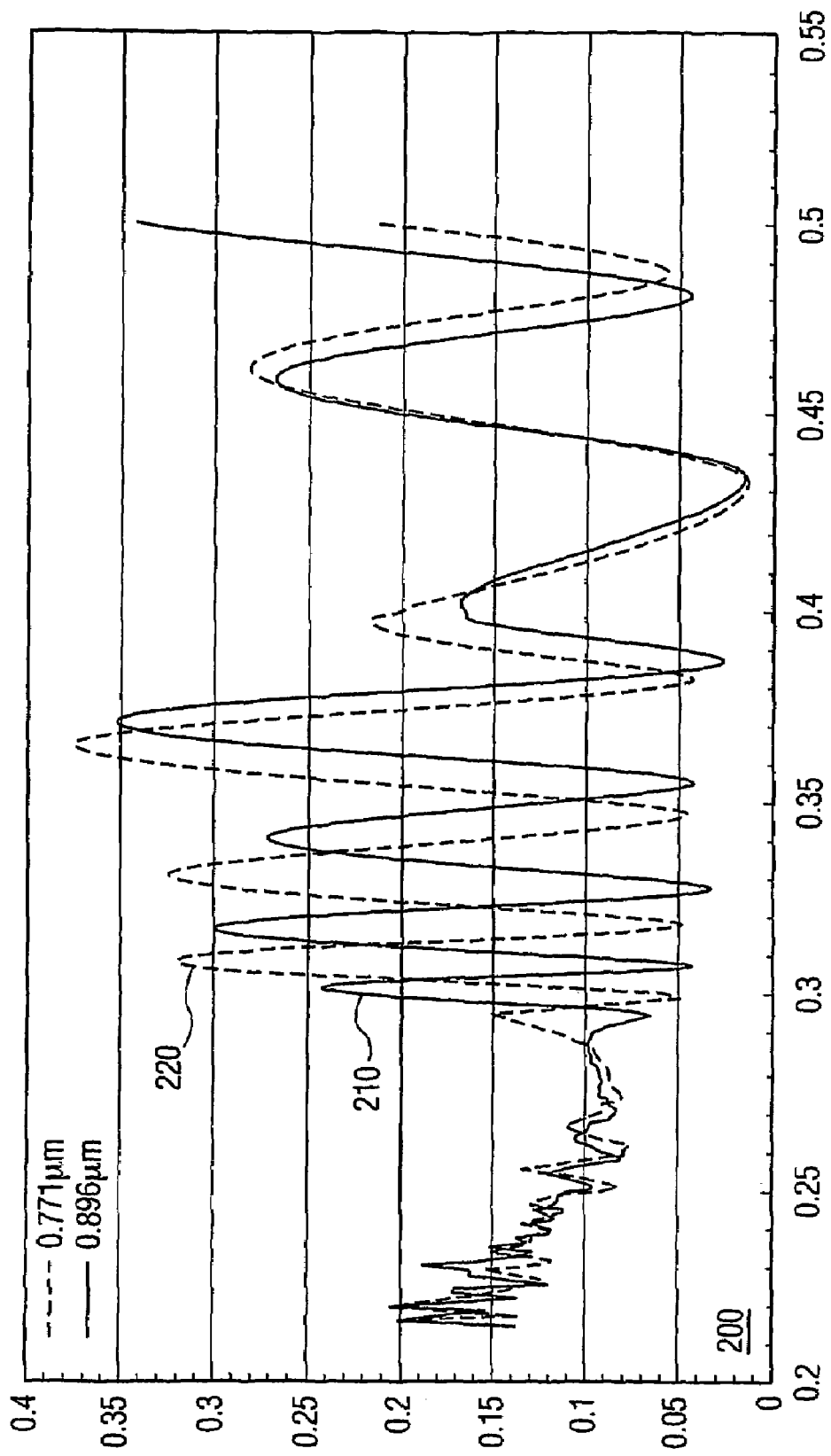
FIG. 3 illustrates UV reflectance spectra reflected from substrates coated with resist films of different thicknesses.

Referring to FIG. 3, the UV reflectance spectra shown are then recorded for the two substrates. The plot 200 is Reflectance v. Wavelength depicts two curves. The first curve 210 is the resist film measured at a thickness 0.896 μm. The second curve 220 is a resist film measured at a thickness 0.771 μm.

Figure 4:
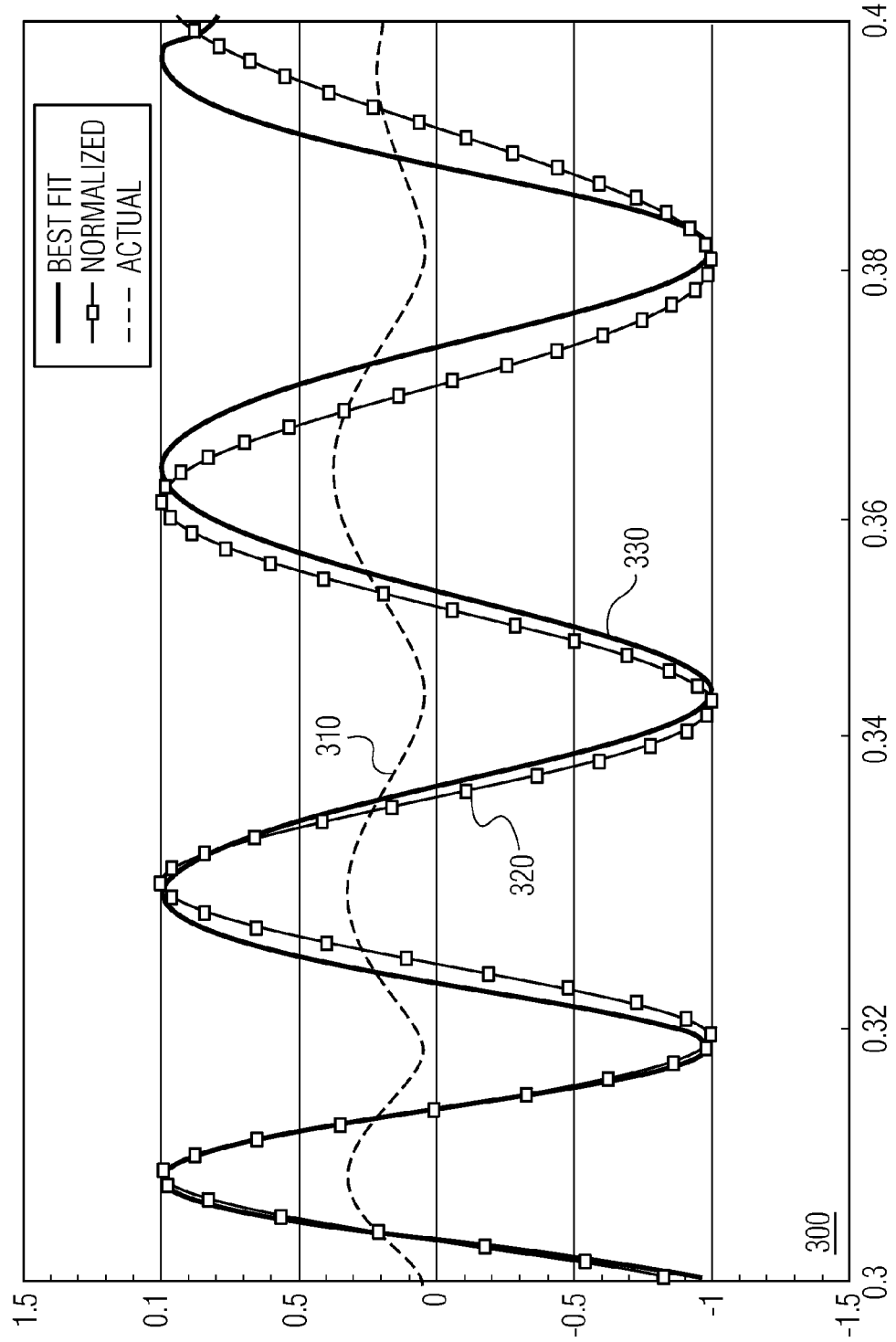
FIG. 4 depicts UV reflectance spectra in the vicinity of the exposing wavelength.

FIG. 4 shows the measured UV reflectance spectrum 300 in the vicinity of the actinic wavelength for the substrate coated with the 0.771 μm resist film. Curve 310 shows actual measurements at the actinic wavelength. Curve 320 shows a normalized plot. The best fit between the measured curve 310 and normalized curve 320 is shown in curve 330.

There are a number of methods available for fitting the sinusoidal components of the reflectance spectra. In the method used in this example, the minima and maxima from each spectrum were extracted and the data were locally scaled to ±1 based on neighboring peaks. A best fit may be found by iterating the Cauchy refractive index constants. Refer back to curve 330 of FIG. 4. This provides the effective refractive index at the actinic wavelength needed for evaluating the periodicity of the swing curve. Table 1 shows the effective refractive indices determined from the substrates coated with the 0.771 μm and 0.880 μm resist films, respectively.

TABLE 1

Effective Refractive Indices

| | Measured Resist Film Thickness | |
|---|---|---|
| | 0.771 μm | 0.880 μm |
| $n_{365}^{Eff}$ | 1.874 | 1.853 |
| Predicted Swing Maxima Thicknesses | 0.780 | 0.788 |
| | 0.878 | 0.886 |
| Predicted Swing Minima Thicknesses | 0.828 | 0.838 |

After the effective refractive indices at the 365 nm exposure wavelength are determined from the reflectance spectra, the periodicity of the swing curve is calculated using the equation:

$$CD = A + B \cos(4\pi n_{365}^{eff} t / \lambda). \quad (6)$$

Thus, the peaks and valleys of the cosine argument are predicted to be the minima and maxima of the swing curve.

Figure 5:
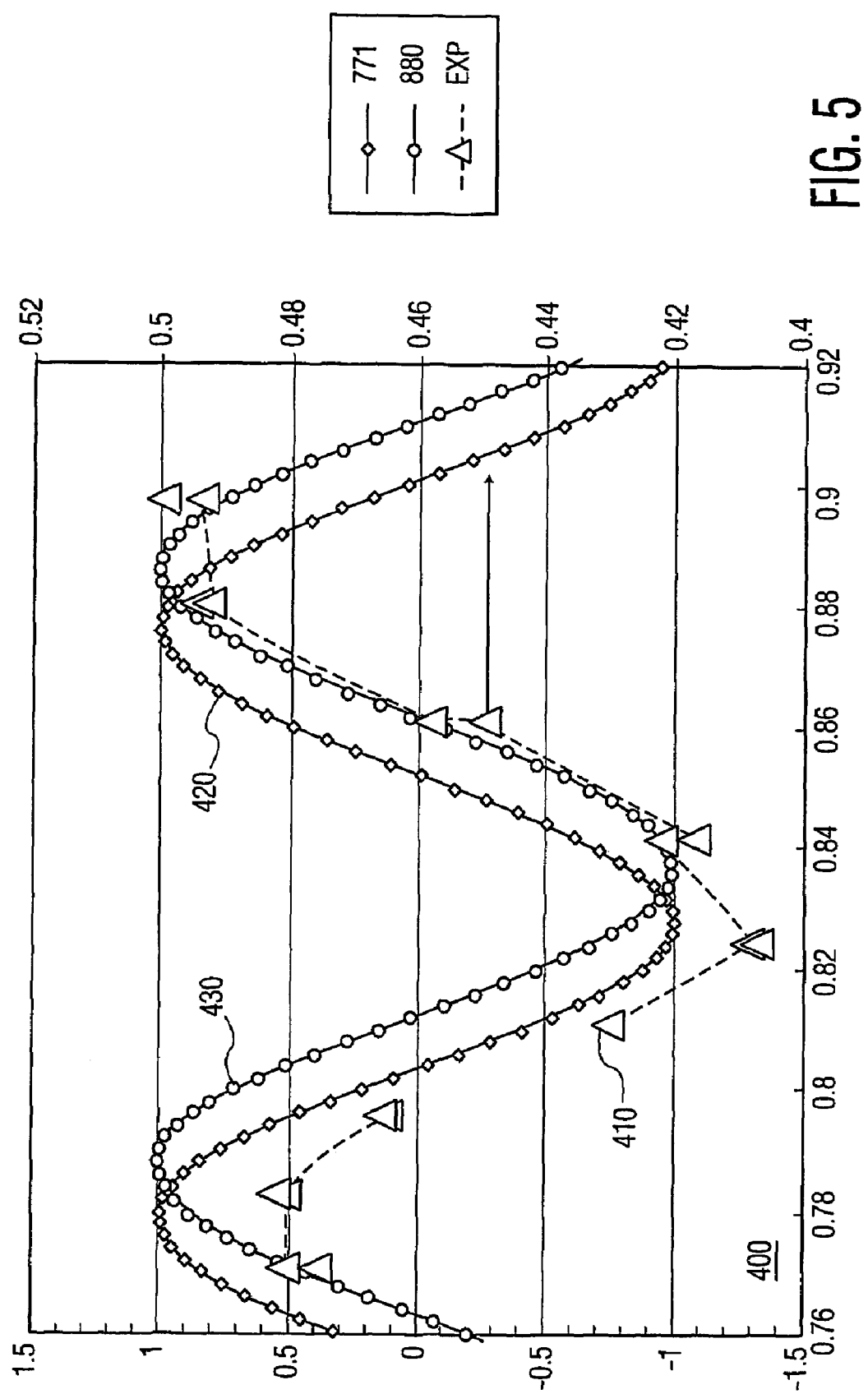
FIG. 5 illustrates a swing curve determined according to an embodiment of the present invention for an example measured swing curve of an SPR600 apparatus.

FIG. 5 shows a comparison of the predicted versus the actual measured swing curves 400. The UV spectrum reflected from the 0.771 μm thick resist film 420 predicts more accurately the maximum at 0.783 μm while the UV spectrum reflected from the 0.880 μm thick resist film 430 predicts the second maximum at 0.880 μm more accurately. Generally, the closer the resist film thickness is to the predicted minimum or maximum 410 the better is the prediction. Therefore, the effective refractive indices are determined at the endpoints of the predetermined range. The corrected minima and maxima are then calculated as the average between the two predictions and weighted inversely to their relative distances from the predictions. Table 2 Summarizes the predictions, weighting factors and measured minima and maxima of the desired resist thickness range.

TABLE 2

Desired Resist Thickness Parameters Summary

| | Measured Resist Film Thickness | |
|---|---|---|
| | 0.771 μm | 0.880 μm |
| First Maximum | | |
| Predicted | 0.780 | 0.786 |
| Distance Coat to Prediction | 0.010 | 0.094 |
| Weight Factor | 0.094/0.104 | 0.01/0.104 |
| Weight Prediction | 0.781 | 0.781 |
| Measured | 0.783 | 0.783 |
| Second Maximum | | |
| Predicted | 0.878 | 0.886 |
| Distance Coat to Prediction | 0.107 | 0.006 |
| Weight Factor | 0.006/0.113 | 0.107/0.113 |
| Weight Prediction | 0.886 | 0.886 |
| Measured | 0.880 | 0.880 |
| First Minimum | | |
| Predicted | 0.828 | 0.838 |
| Distance Coat to Prediction | 0.057 | 0.042 |
| Weight Factor | 0.042/0.099 | 0.057/0.099 |
| Weight Prediction | 0.828 | 0.828 |
| Measured | 0.825 | 0.825 |

In another example embodiment, more than two resist film thicknesses may analyzed for predicting the maxima and minima of the swing curve resulting in more accurate predictions. For example, one may analyze resist film thicknesses at the endpoints of the predetermined range and one thickness close to the optimal thickness. The analysis of more than two resist film thicknesses is easily implemented in the method described above with some minor modifications to the weighting procedure.

In another example embodiment according to the present invention, one may predict the periodicity of the swing curve (on a wafer substrate) from the periodicity of a single spectrum by evaluating both φ and δ at the exposure wavelength. As mentioned earlier, if the reflectance of a coated wafer is known then $\delta_0$, $\delta_1$, and $\delta_2$ can be regressed from its periodic nature provided that the resist thickness has been measured and the refractive index (η) is known as a function of wavelength (λ).

Figure 6:
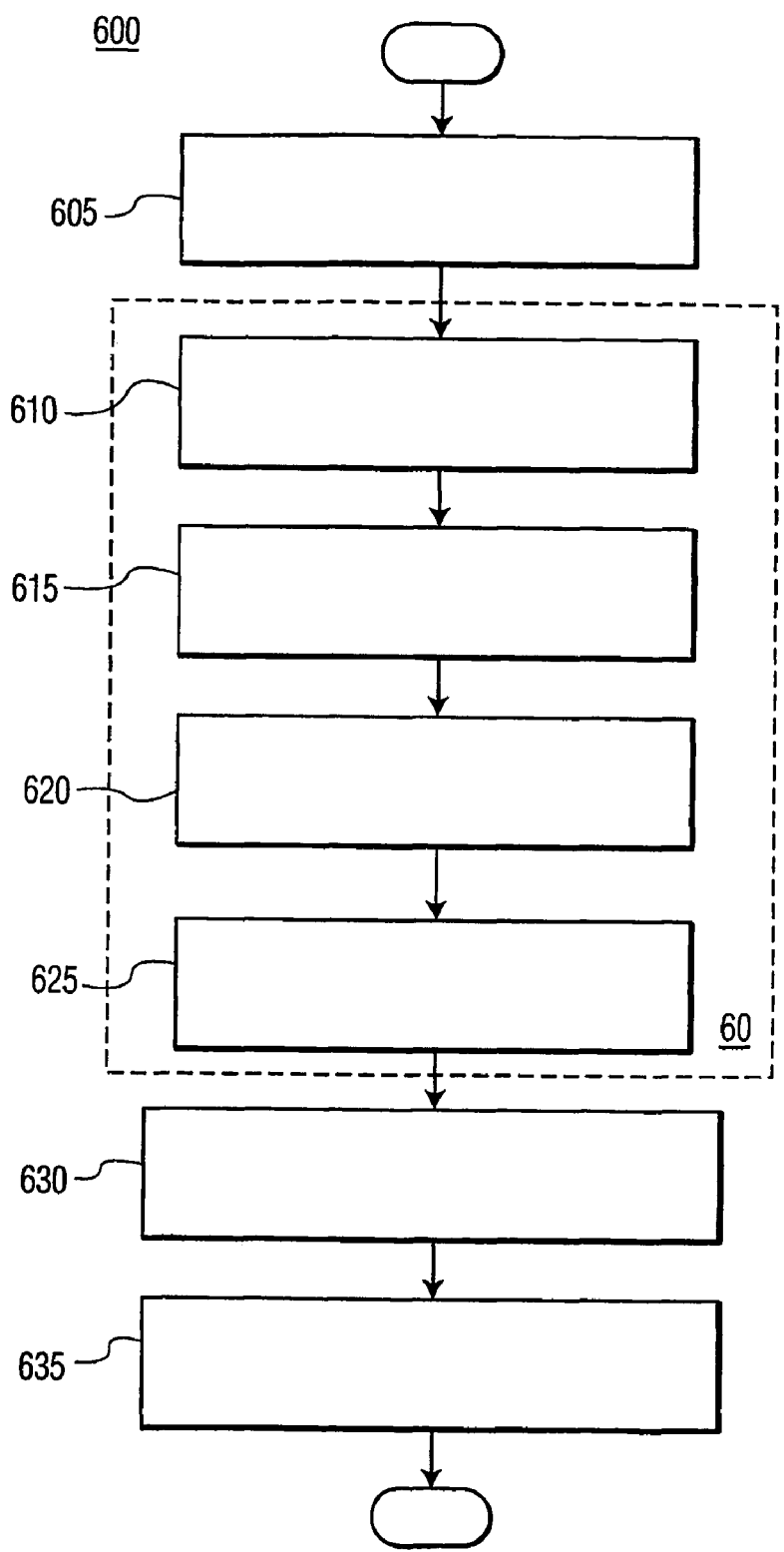
FIG. 6 is a flowchart illustrating a method for predicting the periodicity of swing curves used in determining an optimal resist thickness according to another embodiment of the present invention.

Refer to FIG. 6. In a process 600, date is obtained to predict the periodicity of the swing curve for a given resist and substrate combination. A resist dispenser 605 is programmed to deposit a coat of photo resist at a predetermined thickness. The predetermined thickness depends upon specific process parameters such as, for example, whether the substrate is undergoing front end or back end processing, such as poly-silicon expose and etch or metallization expose and etch. Having set the dispenser, a resist of predetermined thickness is deposited 610 onto a first wafer. The thickness of the resist deposited on the first wafer is measured 615. The resist dispenser is reprogrammed to deposit resist at the measured thickness 620. On a second substrate a coat of resist is deposited on the second substrate 625 at the measured thickness. From the coated second wafer, the user derives the reflectance spectra for the measured resist thickness 630. From the reflectance spectra, the swing curve periodicity is predicted from the periodicity of the reflectance spectra 635 on the coated second wafer.

In an example embodiment, in an experimental analysis of the process outlined in FIG. 6, UV reflectance spectra were measured on a UV1050 (KLA-Tencor, Santa Clara, Calif.). This tool was designed to measure film thicknesses using a mercury (Hg) lamp source having a relatively low intensity from 210 to 300 nm. To avoid noise related errors in this regime, this study was limited to 365 nm (I-line). Two "I-line" resists, SPR660 (Shipley, Marlborough Mass.) and OIR32HD (Arch Chemicals, Providence, R.I.) were used. Note that in principle the technique according to the present invention may be used to characterize the swing curve at any wavelength provided that the reflectance spectra can be accurately measured.

Table 3 summarizes the combinations of two resists and three substrates used in this study. In Table 3, PBL (Poly Buffer LOCOS—local oxidation of silicon) wafers were un-patterned while the gate stack wafers had diffusion wells defined. The general approach utilized in this characterization was to coat two sets of wafers with varying spin speeds. One set was bare silicon that was used to measure resist thickness while the second set was fully processed wafers (PBL or gate stack). After coating, reflectance spectra were measured at the center of each wafer. Note that the un-patterned wafers did not require pattern recognition when measuring reflectivity. However, the reflectance of the gate stack wafers were measured with pattern recognition in a 0.3 mm by 0.3 mm poly over active region over which a grating structure would be imaged. This region was much larger than the spot size of the reflectometer. Wafers were exposed on a Canon I4 stepper (Canon USA, Santa Clara at 0.63 numerical aperture, 0.65 partial coherence and developed on a DNS80B (DNS Electronics, Santa Clara Calif.) developer. Line width measurements were taken on a KLA 8100 (KLA, Santa Clara, Calif.).

TABLE 3

Systems used for Reflectivity and Line width Swing Curve Analysis

| Film Stack | | Thickness | | Measurements | |
|---|---|---|---|---|---|
| Name | Films | Resist | Range (µm) | TARC | Reflectivity | Linewidth |
| Bare Silicon | Silicon Substrate | OIR32HD | 0.74-0.83 | Yes | Center of Wafer | 5 sites across wafer |
| Gate | 0.02 µm Tungsten Silicide 0.30 µm Polysilicon 0.05 µm Silicon oxide Silicon Substrate | OIR32HD | 0.74-0.83 | Yes | Poly on active at center of wafer | 5 sites of same region that was measured for reflectivity |
| PBL | 0.16 µm SiN 0.06 µm amorphous Silicon 0.06 µm Silicon oxide Silicon Substrate | SPR660 | 0.67-0.90 | No | Center of Wafer | 13 sites across wafer |
| PBL | 0.16 µm SiN 0.06 µm amorphous Silicon 0.06 µm Silicon oxide Silicon Substrate | SPR660 | 0.67-0.90 | Yes | Center of Wafer | 13 sites across wafer |

Resist thicknesses for all wafers, including those with Aquatar II TARC (top antireflective coating), were measured on bare silicon wafers assuming only resist as a film stack. The optical effect of the TARC on the measured resist thickness was determined by coating a wafer on silicon without the top coat, measuring and comparing to one coated with the same program with TARC. Note that all resist thicknesses reported in this paper have been corrected, when appropriate, for the effect of TARC on the measurement and refer to measurements on bare silicon.

Figure 8:
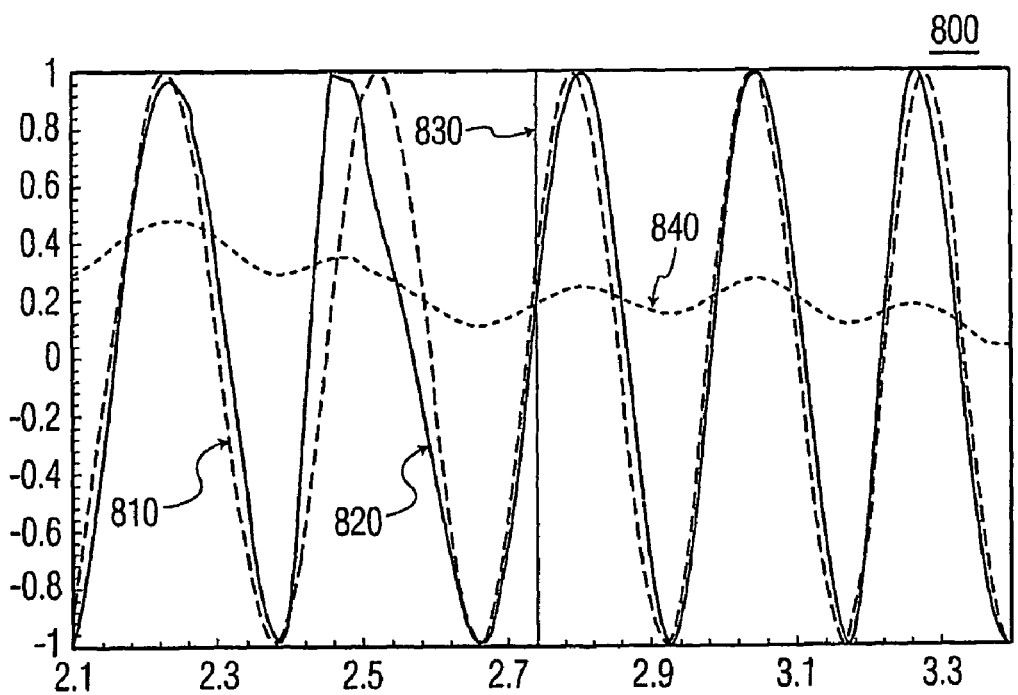
FIG. 8 illustrates the analysis of reflectivity spectra of FIG. 7.

All calculations, including parameter extraction, were done with MICROSOFT EXCEL. A VISUAL BASIC macro was written to facilitate data analysis. However, any other suitable analysis tools may be used, as well. The basic approach was to filter the TV reflectivity spectra to exclude data outside 0.3 to 0.47 µm wavelengths. Cubic splines were used to interpolate and transform the reflectance data from a function of wavelength, $\lambda$, to wave number, $\lambda^{-1}$ since theoretical swing curves are periodic in the latter (see EQ. 3). Wave numbers at which local minimum and maximum occurred were determined and used to normalize the reflectance data to ±1. This normalized reflectance spectra were fit to EQ. 1 by adjusting $\delta_0$, $\delta_1$ and $\delta_2$ and assuming normal incident radiation ($\theta \cong 0$). FIG. 8 shows the results of the OIR32HD with TARC on gate stack reflectance data displayed in FIG. 7.

Figure 9:
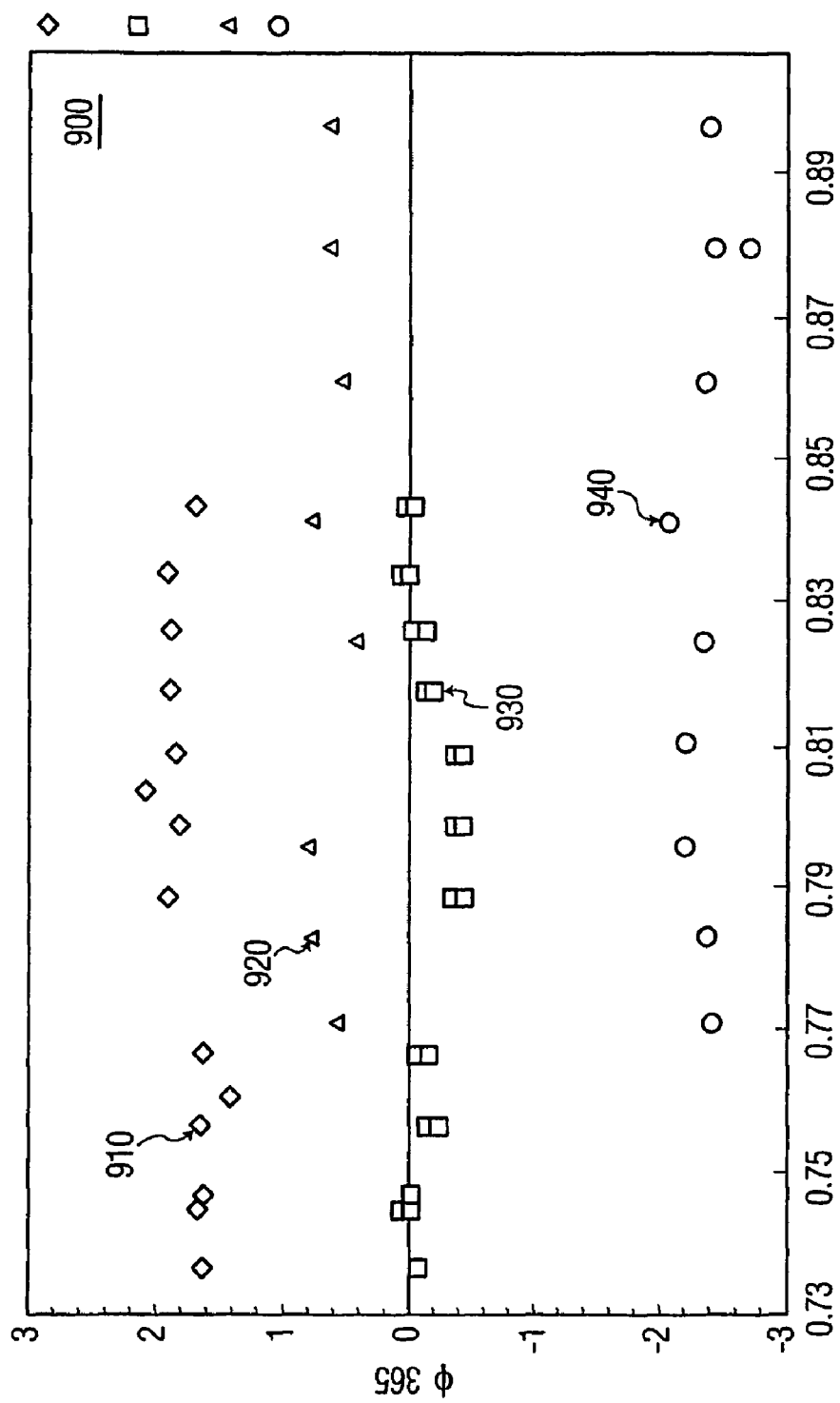
FIG. 9 shows the regression of $\delta_{365}$ from reflectivity spectra of individual wafers.

Values of $\delta_0$, $\delta_1$ and $\delta_2$ were extracted for all 56 wafers used in this study that allowed independent measurements of $\delta_{365}$. According to EQ. 3, $\delta_{365}$ should depend only on the reflectance of films underlying or overlying (i.e. TARC) the resist and be independent of resist thickness. FIG. 9 shows $\delta_{365}$ for all wafers plotted versus resist thickness. Plot 900 depicts four curves (910, 920, 930, 940) as described in Table 4. Each of the 4 film stacks exhibits an intrinsic $\delta_{365}$ that shows no evidence of resist thickness dependence. These data are also summarized in Table 4. Variation in $\delta_{365}$ for the same film stack could be due to slight wafer-to-wafer differences in thicknesses or optical properties of any of the films.

TABLE 4

Summary of Regressed d values for the diff

| Resist/Film Stack | Count | Av $\delta_{365}$ | 3s$\delta_{365}$ |
|---|---|---|---|
| OIR32HD/Aquatar on Silicon 910 | 14 | 1.76 | 0.52 |
| OIR32HD/Aquatar on Gate Stack 930 | 24 | −0.15 | 0.49 |

TABLE 4-continued

Summary of Regressed d values for the diff

| Resist/Film Stack | Count | Av $\delta_{365}$ | 3s$\delta_{365}$ |
|---|---|---|---|
| SPR660 on PBL 920 | 10 | −2.36 | 0.51 |
| SPR660/Aquatar on PBL 940 | 8 | 0.64 | 0.40 |

Figure 10A:
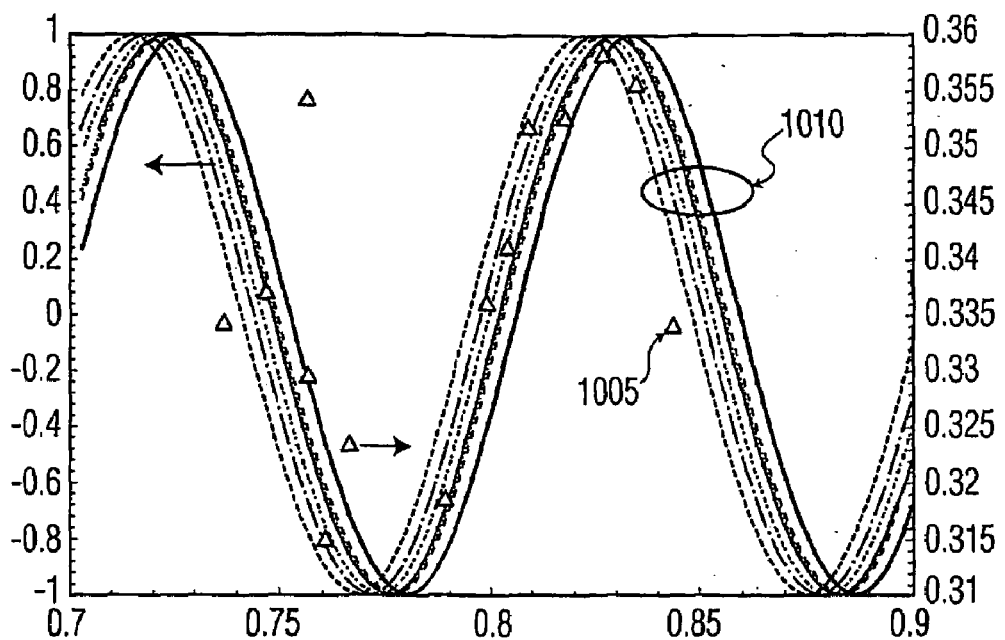
FIG. 10A shows the predicted and measured swing curves for OIR32HD/Aquatar on silicon.
Figure 10B:
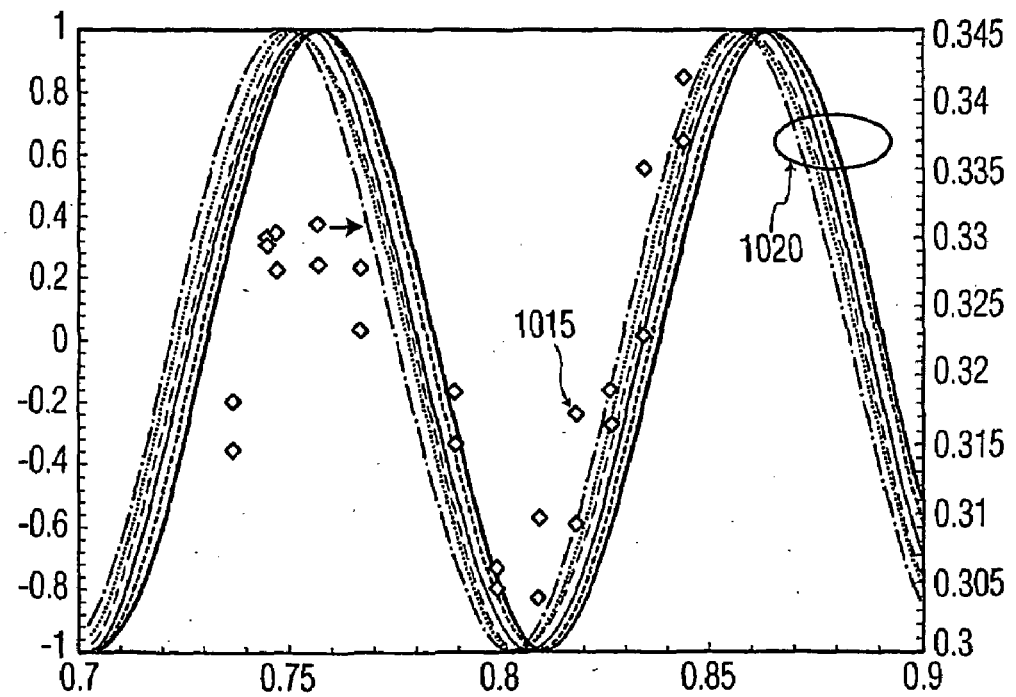
FIG. 10B shows the predicted and measured swing curves for OIR32HD/Aquatar on a gate stack.
Figure 10C:
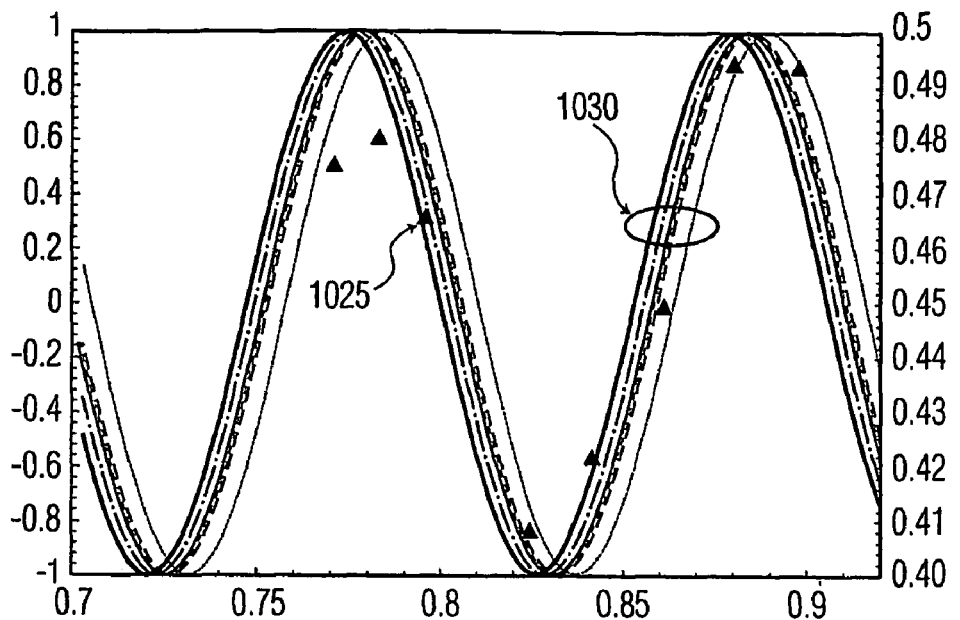
FIG. 10C shows the predicted and measured swing curves for SPR660 on PBL stack.
Figure 10D:
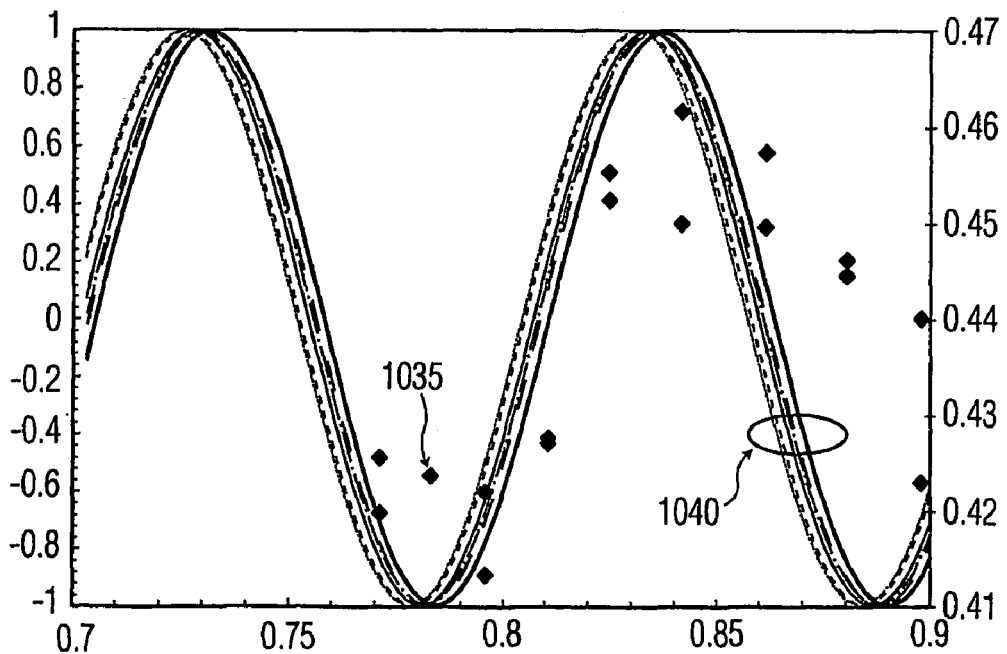
FIG. 10D shows the predicted and measured swing curves for SPR660/Aquatar on PBL stack.

Once $\delta_0$, $\delta_1$ and $\delta_2$ were determined, $\cos(\phi+\delta)\lambda=0.365$ was calculated for each measured spectra assuming normal incidence. FIGS. 10A-10D shows swing curve predictions from each wafer cross-plotted with measured line width. In FIG. 10A, the measured line width 1005 is plotted with swing curve predictions 1010. Likewise, in FIG. 10B measured line width 1015 is plotted with swing curve predictions 1020. Similarly, in FIG. 10C measured line width 1025 is plotted with swing curve predictions 1030. Also in FIG. 10D, measured line width 1035 is plotted with swing curve predictions 1040. Note that each curve is an independent prediction of the relevant swing curve. Typically, predictions on the same substrate agreed within ±0.0045 µm. Table 5 summarizes prediction of local minimum and maximum compared to estimates based on line width measurements versus resist thickness. In all but one case (SPR660/Aquatar on PBL), the predicted extrema bracket the measured value. However, it should be noted that the SPR660/Aquatar on PBL swing curve was relatively noisy so the agreement between predicted and the actual extrema may be significantly better than shown in FIG. 10D.

According to EQ. 3, swing curves are dependent on the incident angle. Note that the UV1050 measures reflectance at near normal incidence whereas stepper patterns were defined from light striking the wafer from angles ranging from ±sin−10.63=±41. Since different lithographic features are imaged from different distributions of incident angles, a correction cannot be easily computed by using EQ. 3. However, modeling can be used to derive this correction since it is purely optical in nature. The approach is simply to use lithographic modeling software such as PROLITH, to predict the swing curve of a generic resist on silicon at low versus the actual NA used. Note that since we are interested in the peak shift caused by NA, the resist and substrate optical properties should have very little effect on these results.

Figure 11:
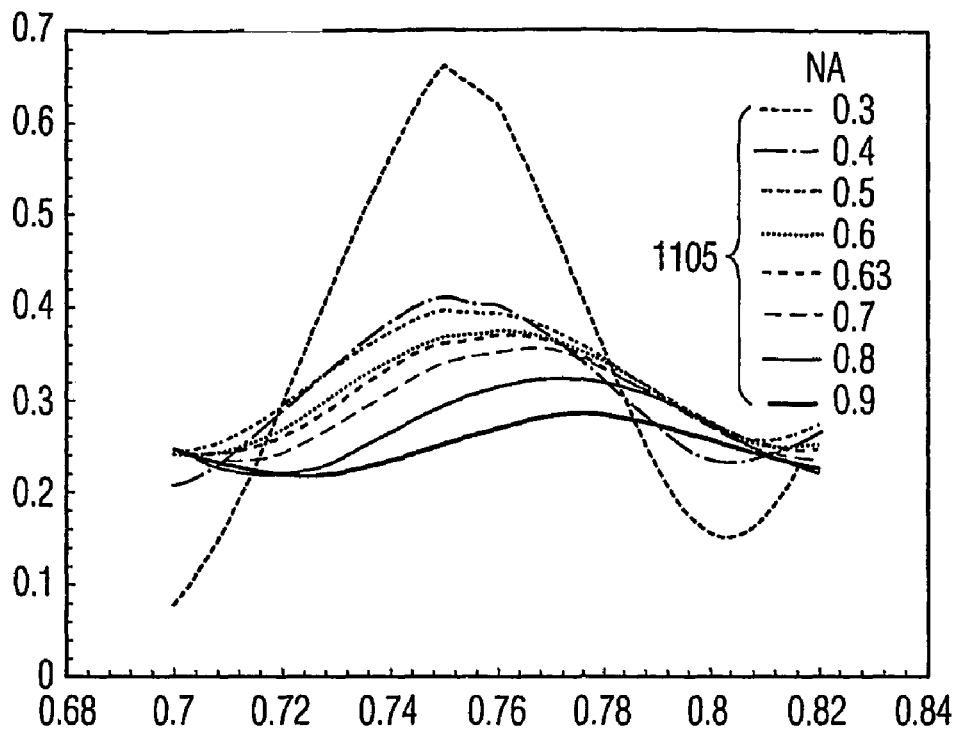
FIG. 11 depicts a modeled swing curve dependence of nominal 0.35 μm lines and spaces as a function of numerical aperture (NA)

FIG. 11 shows the theoretical dependence of a swing curve for 0.35 µm lines and spaces for numerical apertures (1105)

ranging from 0.3 to 0.9. However, the trend is quite apparent in that the swing curve amplitude decreases and peak shift increases relative to low numerical apertures.

Figure 12:
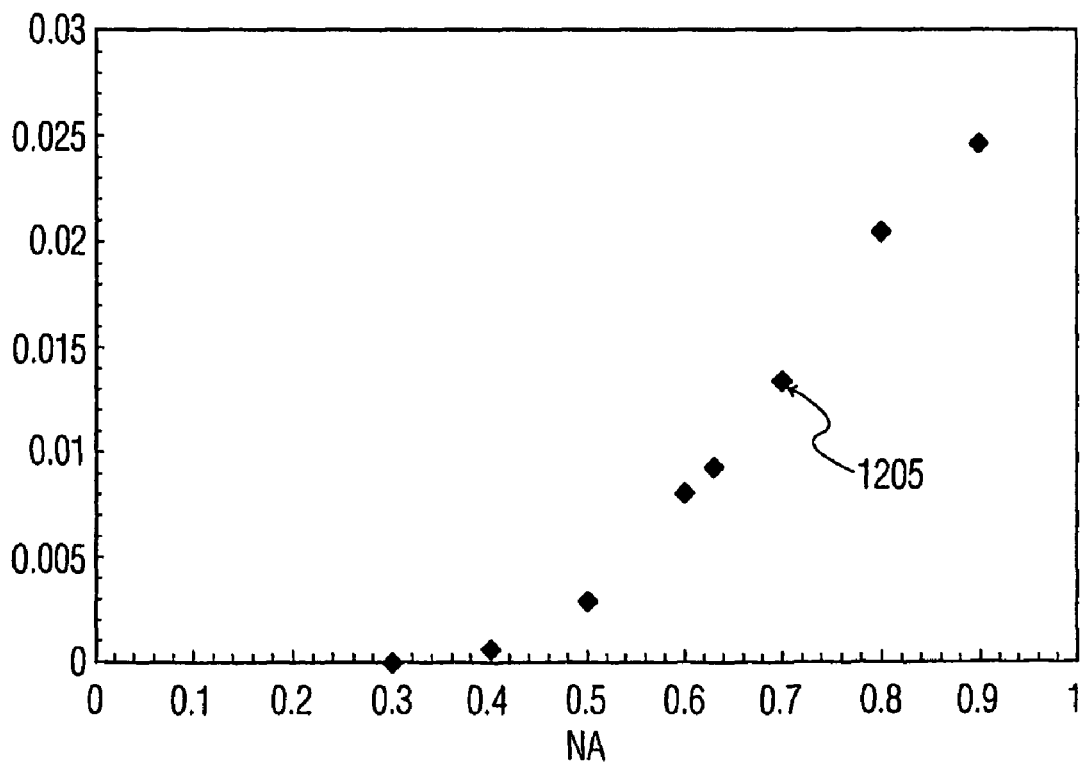
FIG. 12 depicts a swing curve peak shift as a function of NA for nominal 0.35 μm nominal lines and spaces.

FIG. 12 shows peak shift 1205 relative to NA=0.3 as a function of NA. Since the peak shift 1205 is less than 7 Å between NA=0.3 and NA=0.4, we can assume that NA=0.3 approximates what the swing curve would appear at normal incidence. Consequently, a reasonable approach to estimate the swing curve correction due to NA effects is to model results at NA=0.3 and at the NA of the stepper used, then compute the difference and add to that calculated using normal incidence reflectometry.

The methods for determining an optimal resist thickness according to the invention is applicable in the fabrication of state of the art semiconductor devices by substantially increasing accuracy of the determined minima and maxima of the swing curve while simultaneously limiting the number of wafers used to fewer than used with prior art methods. Therefore, the present invention provides a more accurate and less labor-intensive method for determining an optimal resist thickness.

TABLE 5

Comparison of Predicted Local Minimum and Maximum Resist Thicknesses Using UV Reflectance Data and Actual Swing Curve Line Width Results

| Resist/Film Stack | Maximum | | Minimum | |
|---|---|---|---|---|
| | Prediction | Linewith | Prediction | Linewidth |
| OIR32HD/Aquatar on Silicon | 0.823-0.834 | 0.826 | 0.769-0.781 | 0.774 |
| OIR32HD/Aquatar on Gate Stack | 0.751-0.757 | 0.756 | 0.805-0.811 | 0.809 |
| SPR660 on PBL | 0.775-0.784 | 0.783 | 0.826-0.838 | 0.829 |
| SPR660/Aquatar on PBL | 0.832-0.838 | 0.838 | 0.778-0.787 | 0.796 |

While the present invention has been described with reference to several particular example embodiments, those skilled in the art will recognize that many changes may be made thereto without departing from the spirit and scope of the present invention, which is set forth in the following claims.

What is claimed is:

1. A method for determining an approximately optimal resist thickness, comprising the steps of:
   a) providing a first substrate coated with a resist film having a first thickness using a first coat program;
   b) measuring the first thickness
   c) providing a second substrate coated with a resist film using the first coat program;
   d) exposing the resist film on the second substrate to radiation and measuring a reflectance spectrum near the actinic wavelength of the resist film;
   e) determining an effective refractive index as a function of a periodicity of the reflectance spectrum;
   f) determining a periodicity of a swing curve of the resist film coated on the second substrate based on the effective refractive index; and
   g) determining maxima and minima as a function of the periodicity.

2. The method of claim 1 further comprising the steps of:
   h) repeating steps a) to g) using a second coat program for providing a resist film having a second thickness; and
   i) determining average maxima and minima as a function their respective periodicities.

3. The method of claim 2, wherein the first substrate comprises a simple substrate.

4. The method of claim 3, wherein the first substrate comprises silicon.

5. The method of claim 2, wherein the first thickness is chosen to be near a lower limit of a predetermined range for the optimal resist thickness.

6. The method of claim 5, wherein the second thickness is chosen to be near an upper limit of the predetermined range for the optimal resist thickness.

7. The method of claim 6, wherein step e) the periodicity of the reflectance spectrum is fitted to $\cos(4\pi n^{Eff} t/\lambda)$ with $n^{Eff}$ being the effective refractive index, t being the thickness of the resist film, and $\lambda$ being the wavelength of the radiation.

8. The method of claim 7 wherein the radiation comprises UV radiation.

9. A method for determining an approximately optimal resist thickness, comprising the steps of:
   a) providing a first substrate coated with a resist film having a first thickness using a first coat program, the first thickness being near a lower limit of a predetermined range for the optimal thickness;
   b) measuring the first thickness;
   c) providing a second substrate coated with a resist film using the first coat program;
   d) exposing the resist film on the second substrate to UV radiation and measuring a UV reflectance spectrum near the actinic wavelength of the resist film;
   e) determining an effective refractive index as a function of a periodicity of the reflectance spectrum;
   f) determining periodicity of a swing curve of the resist film coated on the second substrate based on the effective refractive index; and,
   g) determining maxima and minima as a function of the periodicity.

10. The method of claim 9 further comprising the steps of:
    g) repeating steps a) to f) using a second coat program for providing a resist film having a second thickness, the second thickness being near an upper limit of the predetermined range for the optimal thickness; and
    h) determining average maxima and minima as a function their respective periodicities.

11. The method of claim 10 wherein the first substrate comprises a simple substrate.

12. The method of claim 11 wherein the first substrate comprises silicon.

13. The method of claim 10 wherein step e) the periodicity of the UV reflectance spectrum is fitted to $\cos(4\pi n^{Eff} t/\lambda)$ with $n^{Eff}$ being the effective refractive index, t being the thickness of the resist film, and $\lambda$ being the wavelength of the radiation.

14. A method for determining an approximately optimal resist thickness comprising:
    providing two wafers comprising a simple first substrate;
    providing two wafers comprising a second substrate;
    coating the two wafers comprising the first substrate with resist films having a first and a second thickness near an upper and a lower limit of the predetermined range for the optimal resist thickness, respectively, using a first and a second coat program;
    measuring the first and the second thickness;
    coating the two wafers comprising the second substrate with resist films using the first and the second coat program;
    exposing the resist film on the two wafers comprising the second substrate to UV radiation and measuring a first and a second UV reflectance spectrum near the actinic wavelength of the resist films;

fitting sinusoidal components of the first and the second UV reflectance spectrum to a cosine argument;

determining a first and a second effective refractive index at the actinic wavelength based on the fitted sinusoidal components of the first and the second UV reflectance spectrum;

determining minima and maxima of a first and a second swing curve using the first and the second effective refractive index, respectively; and determining corrected minima and maxima by averaging the minima and maxima of the first and the second swing curve.

15. The method of claim 14 wherein the first substrate comprises silicon.

16. The method of claim 14 wherein the periodicity of the UV reflectance spectrum is fitted to $\cos(4\pi n^{Eff}t/\lambda)$ with $n^{Eff}$ being the effective refractive index, t being the thickness of the resist film, and $\lambda$ being the wavelength of the radiation.

17. The method of claim 16 wherein a best fit is found by iterating a Cauchy expansion of the effective refractive index.

18. The method of claim 17 wherein the corrected minima and maxima are weighted inversely to their relative distances from the determined minima and maxima.

19. The method of claim 18 wherein the predetermined range is between 0.8 µm and 0.9 µm.

* * * * *